United States Patent Office 3,402,083
Patented Sept. 17, 1968

3,402,083
POWDERLESS ETCHING METHOD FOR ETCHING RELIEF IMAGES IN ALUMINUM

Robert J. Patsko, Merion Station, and William C. Guenst, Jr., Fort Washington, Pa., assignors to Master Etching Machine Company, Ambler, Pa., a corporation of Pennsylvania No Drawing. Filed June 16, 1965, Ser. No. 464,571
8 Claims. (Cl. 156—14)

ABSTRACT OF THE DISCLOSURE

The invention relates to the powderless etching of relief images in aluminum by a bath comprising an aqueous solution of a ferric halide such as ferric chloride, a sulfated or sulfonated castor oil, and a water-immiscible organic solvent substantially unreactive with the ferric halide.

DESCRIPTION OF INVENTION

This invention relates to a method of etching metallic plates and more particularly to a powderless etching system and method for the etching of aluminum and aluminum base alloy plates.

In the etching of metal plates to produce a printing surface as in the making of a photoengraving, the plates are commonly coated with a photosensitive resist composition, which is then exposed to light through a negative. After development and subsequent hardening of the coating it becomes resistant to the attack of the etchant in the image areas produced on the coating. The surface of the plate is then subjected to an etching solution, the unexposed area being etched away while the acid resistant coating protects the image areas of the plate. If the metal plates are etched with an uninhibited etchant, the etchant will attack the metal indiscriminately and will not only etch away perpendicular to the surface of the plate but will also etch away laterally. This loss is measured in terms of an etch factor which is defined as the ratio of the etched depth to the lateral image loss of an image edge. In conventional methods of etching metallic plates with uninhibited etchants, the factor will be in the range of from 1.0 to 1.5, which indicates that the metal has been etched as much laterally as it has been in depth. With an etch factor near 1.0, the plate is unsatisfactory for use in the printing industry. This would mean that if a plate had been etched to a depth of .03 inch the lateral cutting away of the image areas would also be about .03 inch. Higher etch factors are necessary for the production of acceptable printing plates. An etch factor of 50 would indicate that at an etching depth of .03 inch in the resist free areas, the lateral cutting would be held to about .0006 inch.

In the etching of magnesium and zinc plates which are conventionally used in the production of printing plates using an acid resist, a powderless etching system has been developed which prevents lateral etching of the relief images to an acceptable degree as disclosed in the following U.S. Patents Nos.: 2,640,763 to 2,640,767, 2,828,194 and 2,846,295. This system comprises essentially an acid as the etching component, a filming agent and a water-immiscible organic fluid suitably a solvent. The combination of the filming agent and the solvent in the etchant bath selectively forms an acid resistant film on the sides of the relief images as the plate is etched away in the resist free areas. This film minimizes lateral etching while not inhibiting the direct etching of the resist free areas of the plate.

More recent developments in the art as shown in U.S.

Patents Nos. 3,023,138 and 3,152,083 have provided an additive for these powderless etching systems, which additives function as a film-controlling agent giving increased beneficial properties to the protective film agent. With this additive, an increased etched depth is achieved in small areas where fine detail in the image is required without substantial lateral etching of the relief image. This additive system has given rather high etch factors in the making of photoengraving plates in the etching of magnesium and zinc plates using nitric acid as the etchant material as disclosed in these patents.

The art, however, has never provided a system for the satisfactory etching of aluminum. While it is known that certain materials would attack aluminum and etch it away, there is not known any satisfactory way to prevent lateral etching in aluminum. Consequently, the etch factors for aluminum have always remained around 1.0.

It is, therefore, an object of this invention to provide a powderless etching system for the etching of relief images on aluminum and aluminum base alloy plates.

It is a further object of this invention to provide such a system for etching aluminum which will produce greatly increased etched factors in the final etched plate.

It is a further object of this invention to provide a powderless etching system for the etching of aluminum plates which will be economical in operation with respect to the initial cost of the etching bath, its useful life and the rate of etching.

It is a further object of this invention to provide a system for etching a lightweight aluminum plate to produce a photoengraving which is stronger and capable of longer sustained use in a printing operation than was heretofore obtainable with the metals that have previously been used in the production of printing plates.

Applicants have discovered that by providing an etching bath of an aluminum reducible heavy metal aqueous salt such as a ferric halide with an anionic surfactant such as sulfated or sulfonated castor oil and a water-immiscible organic fluid unreactive with the aqueous ferric halide, that high etch factors heretofore unobtainable can be achieved using an acid resist on aluminum or aluminum base alloy plates. While it has been known that aqueous heavy metal salts such as ferric chloride will etch aluminum quite rapidly, there has been no known method of selectively inhibiting the ferric chloride to prevent it from causing lateral loss of the image. This invention provides an etching system for aluminum using an etchant such as ferric chloride which eliminates or minimizes any image loss of the acid resistant image.

The etching of alumina is essentially a reduction of a metal ion in the etchant from a high valence state to a lower one by the action of the aluminum and thus an aqueous solution of an aluminum reducible heavy metal salt is suitable for use in this invention. Such high valence metals might include chromium, cobalt, iron, nickel, tin and the like. More specifically, the etchant would suitably be a member of the group of halogenated salts of iron such as ferric chloride, ferric bromide, and ferric fluoride although the chloride is preferred as the other ferric halides have limited aqueous solubility. Since only the metal ion is reduced, other compounds of iron besides the halide would be suitable for etching purposes such as ferric sulfate and ferric nitrate in aqueous solutions.

When these aqueous solutions of the aluminum reducible heavy metal salts are used alone, they attack the metal indiscriminately and etch as much laterally as they do deep. Since the reduction is exothermic and since the temperature of the bath is proportional to the rate of etching, if left to proceed without supervision, the solutions would soon etch away the entire plate. Applicants by this invention have found a way to control the etching of aluminum with these solutions, while providing greatly increased etch factors.

The aqueous solution of the ferric halide, for example, ferric chloride, used as the aluminum reducible compound in this invention is in the range of from 30° to 40° Bé. and has a pH of approximately 1 with approximately .03% hydrochloric acid present in the solution.

As will be more fully explained in the examples, a source of free hydrochloric acid should be present in the solution in order to form aluminum chloride with the etched aluminum. Therefore, it was found that periodic additions of an aqueous solution of hydrochloric acid rejuvenated the etching bath after it had been used for a time thus maintaining its high etch factor characteristics through a plurality of etching operations.

Film-forming agents which will prevent lateral etching of the aluminum and give increased etch factors suitable for use in this invention are members of the class of sulfated and sulfonated castor oils. The castor oil used in the following examples was a 75% sulfonated castor oil containing 25% water.

The water-immiscible organic fluid should be an aromatic, aliphatic, or naphthenic hydrocarbon boiling within the range of 90° through 390° C. that is substantially unreactive with the etching solution. For example, kerosene, naphthalene, alkylated benzenes such as diethyl benzene or diisopropyl benzene and the like. A commercially available aromatic solvent such as Solvesso 150 having 90% alkyl benzenes, 2% naphthalene and 8% naphthenes is equally suitable for use in this invention. It has a flash point of 150° F. and a distillation range at 1 atmosphere of 303° F. as an intiial boiling point and 415° F. as the dry point.

Commercially available mixtures of the film-forming agent and the organic solvent are also suitable for use in this invention. These include Addo-Sol (Philip A. Hunt Co.) and Vitaguard (Imperial Type Metal Co.) which comprise a 75% sulfonated castor oil containing 25% water and an aromatic solvent, the solvent to oil ratio being in the range of from 2:1 to 3:1.

The mixture of film-forming agent and solvent in the etching bath should be present within the range of 1% to 5% of the total volume of the bath, the preferred amount being approximately 3%. The mixture should have at least .08% castor oil and .8% solvent up to a maximum of 1.6% oil and 3.2% solvent. A preferred ratio of solvent to oil within these limits is 2.5 to 1.

The temperature of the etchant should be maintained within a range of from 60° F. to about 90° F. so that the etching process can be controlled. Preferably the temperature of the bath should be around 80° F. as this temperature appears to produce the best etch factor.

Various types of aluminum and aluminum base alloys were used in determining the etchability of the metal with the novel etchant bath of this invention. These included the following alloys having the following essential components in their composition by percent the remainder being aluminum:

| Aluminum Alloy | Si | Cu | Mn | Mg | Cr | Zn |
|---|---|---|---|---|---|---|
| 2S | 0.4 | | | 0.6 | | |
| 3S | | | 1.2 | | | |
| 24S | | 4.5 | 0.6 | 1.5 | | |
| 52S | | | | 2.5 | 0.25 | |
| 61S | 0.6 | 0.25 | | 1.0 | 0.25 | |
| 75S | | 1.60 | | 2.50 | 0.30 | 5.60 |

The compositions also included negligible amounts of all the other elements not listed plus some iron and titanium. While the etchant was found to produce a controlled etched surface on all the samples of aluminum, some were found to have higher etch factors and etch rates than did others. All factors being considered, the etchability of the alloys had the following order proceeding from highest to the lowest. 61S, 24S, 52S, 3S, 2S and 75S.

By way of example only to illustrate the invention and with no intention to be limited thereby, the following examples are shown wherein the novel etching bath is used on a 61S type aluminum alloy plate. In all the examples, the etchant bath was impinged upon the surface of the aluminum plate using a conventional paddle type etcher. More specifically, a Master Etching Machine Company etcher Model No. Pc–32 was used, wherein the paddles were rotated at 550 r.p.m. and extended into the etchant bath approximately ⅝ inch. Alternatively, the etchant could be impinged on the plate by any other method well known in the art such as by spraying or by splashing.

Example 1

A powderless etching bath was prepared consisting only of an aqueous solution of ferric chloride of 30° Bé. A sample of 61S type aluminum alloy that had been heat treated in the solubilizing range around 900° F. and then rapidly quenched in water and then having a polyvinyl alcohol acid resist applied thereon was descummed by brushing the surface with the ferric chloride solution.

The plate was then placed in the etcher above described with the paddles rotating at 550 r.p.m. Various times and temperatures were used and the following results were obtained. The etch factor ($D/L$) is equal to the depth of the etch divided by one-half of the total image loss. The etching solution was used for successive runs, thus increasing continuously the total weight of aluminum in the bath that had been etched from the plates.

| Run | Temp. (°F.) | Time (Min.) | Etched Depth (In.) | Total Lateral Image Loss (In.) | Etch Factor ($D/L$) | Total Weight of Metal Etched (oz.) |
|---|---|---|---|---|---|---|
| 1 | 55 | 8 | .0085 | .0152 | 1.1+ | ¼ |
| 2 | 62 | 15 | .018 | .0334 | 1.1− | ¾ |
| 3 | 62 | 23 | .027 | .0539 | 1.0+ | 1½ |
| 4 | 62 | 15 | .015 | .0306 | 1.0− | 2 |

Thus, with a straight aqueous solution of ferric chloride, the etch factor never rose above one which is entirely unacceptable for use in the making of a printing plate.

Example 2

Using the same etchant of Example 1 which contained 25 quarts of ferric chloride of 30° Bé., there was added .75 quart of Addo-Sol, the commercially available mixture of sulfonated castor oil and an organic solvent as above described. There was now 97% of the ferric chloride by volume and 3% of the film-forming mixture by volume of the total volume of the bath with 2 ounces of aluminum now existing in the bath. The following results were obtained.

| Run | Temp. (° F.) | Time (Min.) | Depth (In.) | Total Lateral Image Loss (In.) | Etch Factor | Total Weight of Metal Etched (oz.) |
|---|---|---|---|---|---|---|
| 5 | 68 | 15 | .016 | .003 | 10.7− | 2¼ |
| 6 | 72 | 23 | .022 | .0032 | 13.7+ | 2¾ |
| 7 | 72 | 30 | .029 | .0011 | 52.7+ | 3¼ |

This example shows that with the addition of the oil and solvent that greatly increased etch factors of up to 10 to 50 times greater are obtainable. The bath now has a total aluminum content of 3¼ ounces so further tests were conducted to determine if the bath was effective for long enough periods of time to be economical for use in a commercial etching process.

Example 3

The same bath used in Example 2 was allowed to sit over a period of three days and then the following tests were conducted similar to those in Example 1 using the same 61S type aluminum alloy plates.

| Run | Temp. (°F.) | Time (Min.) | Depth (In.) | Total Lateral Image Loss (In.) | Etch Factor (D/L) | Total Metal Etched (oz.) |
|---|---|---|---|---|---|---|
| 8 | 72 | 18 | .016 | .003 | 10.7− | 4.0 |
| 9 | 72 | 23 | .032 | .0037 | 17.3− | 4.75 |
| 10 | 72 | 50 | .047 | .098 | 1.0− | 5.75 |

It has thus been shown that the initial bath has a useful life of approximately 5 ounces of aluminum etched per 25 quarts of ferric chloride. At this time the bath contained a gelatinous dark precipitate. The presence of the precipitate prevented the bath from keeping its image protecting properties as shown in run No. 10 where the etch factor fell back to 1.0. It was reasoned that the precipitate formed due to a reduction in the ratio of free hydrochloric acid in the bath to the amount of aluminum etched that now existed in the bath. Thus, if additional quantities of hydrochloric acid were added to the bath to increase this ratio of acid to aluminum, that the precipitate would redissolve and high etch factors would again be achieved.

Example 4

A small amount of 30% hydrochloric acid (15 ml.) was then added to the bath of Example 3 and additional runs were made but the etch factor still remained at 1.0.

| Run | Temp. (°F.) | Time (Min.) | Depth (In.) | Total Image Lateral Loss (In.) | Etch Factor (D/L) | Total Metal Etched (oz.) |
|---|---|---|---|---|---|---|
| 11 | 80 | 18 | .020 | .0324 | 1.2+ | 6¼ |
| 12 | 90 | 18 | .023 | .0304 | 1.5+ | 6¾ |
| 13 | 72 | 10 | .0085 | .0147 | 1.1+ | 7 |

It thus appeared that greater quantities of hydrochloric acid were needed to dissolve the precipitate.

Example 5

Using the etching bath of Example 4, 1600 ml. of 30% hydrochloric acid were added to the bath. It was determined stoichiometrically that 1600 ml. of 30% hydrochloric acid would convert at least 5 ounces of aluminum to aluminum chloride, and this amount was added to achieve the proper balance between the acid and the aluminum, thus preventing the formation of the precipitate.

| Run | Temp. (° F.) | Time (Min.) | Depth (In.) | Total Image Lateral Loss (In.) | Etch Factor (D/L) | Total Metal Etched (oz.) |
|---|---|---|---|---|---|---|
| 14 | 72 | 10 | .009 | .0014 | 12.8+ | 7¼ |
| 15 | 72 | 30 | .024 | .001 | 48+ | 8 |

800 ml. of 30% hydrochloric acid were added without any adverse effect being realized from an over abundance of hydrochloric acid.

| | |
|---|---|
| Run | 16 |
| Temp. (° F.) | 72 |
| Time (min.) | 30 |
| Depth (in.) | .024 |
| Total image lateral loss (in.) | .001 |
| Etch factor (D/L) | 48+ |
| Total metal etched (oz.) | 8½ |

Thus, free hydrochloric acid must be periodically added to the bath to rejuvenate its image protecting quantities after the amount of aluminum reaches a level above approximately 4 ounces in the etching bath. Further tests were conducted periodically adding additional amounts of hydrochloric acid to determine how long it would continue to rejuvenate the bath.

Example 6

Without any additions of any components two more runs were made with the etchant bath of Example 5.

| Run | Temp. (°F.) | Time (Min.) | Depth (In.) | Total Image Lateral Loss (In.) | Etch Factor (D/L) | Total Metal Etched (oz.) |
|---|---|---|---|---|---|---|
| 17 | 72 | 20 | .017 | .0016 | 21.1+ | 8½ |
| 18 | 72 | 33 | .025 | .0032 | 15.6+ | 9½ |
| Adding 300 ml. of 30% HCl to the bath | | | | | | |
| 19 | 72 | 35 | .024 | .0032 | 15.0 | 10½ |
| Adding 300 ml. more of 30% HCl | | | | | | |
| 20 | 68 | 40 | .023 | .0016 | 28.7 | 11½ |

The etch factor still remains high and acceptable for use in the production of photoengravings when additions of hydrochloric acid are made to the bath. The original etchant solution of 25 quarts has now etched upwards of 11 ounces of aluminum which makes the process very economical. This shows that the capacity of the etchant is at least on the order for from 1.5 to 2.0 ounces of aluminum per gallon of etchant provided acid additions are made.

Example 7

Using a 61S type aluminum alloy plate with a photoresist as in Example 1, an etchant bath of 25 quarts of ferric chloride of 30° Bé. and 20 ml. of a 75% sulfonated castor oil was prepared without any solvent additions making a total of .08% oil in the bath. The etcher was run at a speed of 550 r.p.m. and at a temperature of 68° F. for 20 minutes. With the sulfonated castor oil alone in amounts up to 1.6% of the bath no protection was afforded to the image and the plate was nearly completely etched away.

With .08% oil in the bath when 200 ml. of Solvesso Solvent 150 was added to the bath making a total of .8% solvent based on the volume of the bath, the etch factor was measured at 3.5 but little protection was being afforded to the relief image. 600 ml. more of solvent were added making a bath containing approximately .08% oil and 3.2% solvent, the etch factor, however, still remaining at around 3.0. When 50 ml. more of oil was added so that the bath now had approximately .3% oil, the etch factor rose to 24.7 and after a final addition of 150 ml. more of oil the bath now containing approximately 3.2% solvent and .9% oil, the etch factor reached 37.5.

Example 8

Additional etchings were made similar to Example 7 with an etchant bath consisting of 25 quarts of 30° Bé. ferric chloride, 500 ml. of solvent and 250 ml. of sulfonated castor oil. The bath thus had 1.0% oil and 2.0% solvent with an approximate ratio of 2 parts of solvent per part of oil. Running the etcher at a speed of 500 r.p.m. for 20 minutes with the bath at 68° F., the etch fastor was approximately 37. When 50 more ml. of oil were added, the factor rose to over 50, the bath now containing 1.2% of oil.

However, when 100 more ml. of oil were added making a total of 400 ml. or 1.5% of the bath and 300 ml. of solvent was added making a total of 800 ml. of solvent or 3.2% of the bath, no etch was produced in the plate. Thus, if the bath contains excess oil and solvent, it will lose its etch protecting qualities and will instead protect the whole surface of the plate from being attacked by the etchant.

Example 9

Using an etch bath similar to Example 8, containing 100 ml. or .42% of oil, the amount of solvent was varied between 200 and 400 ml. or between .8% to 1.6% of the total volume of the bath. The etch depth achieved each time was around .020 inch and the etch factor remained constant around 25 for all amounts of solvent.

Example 10

Starting with an etch bath similar to Example 8 containing 150 ml. or .6% of oil and 150 ml. or .6% of solvent and subsequently adding additional quantities of solvent, the following variation in the etch factor at an approximate etched depth of .020 inch for each run was obtained:

| Ml. of Oil in the Bath | Ml. of Solvent in the Bath | Etch Factor |
|---|---|---|
| 150 | 150 | 1.0 |
| 150 | 250 | 34 |
| 150 | 350 | 80 |
| 150 | 400 | 120 |
| 150 | 450 | 60 |
| 150 | 650 | 21.8 |

A ratio of 1:1 parts of solvent per oil afforded no protective qualities to the bath and a ratio of approximately 2.7 to 1 appeared to give the highest etch factor. The use of higher ratios caused the etch factor to fall off again.

It was found that when plates were etched under conditions similar to those used in Example 1 with 42° Bé. ferric chloride that the plates only etched to a depth of .009 inch, whereas 30° Bé. ferric chloride had etched approximately twice as much as shown in Example 1. Dilution of 42° Bé. to 30° Bé. produced good etched depths. However, 20° Bé. ferric chloride was too diluted and produced no etch at all.

Photoresists were used in these test samples, but it was found that when glue based resists which require temperatures in excess of 500° F. to convert them to acid resists were used, poor etchability of the aluminum occurred because such also altered the physical condition of the alloy. When photoresists which did not require temperatures in excess of 400° F. were used, this did not occur.

In photoengraving and in the maufacture of relief printing plates, there are inherent advantages to be gained over zinc and magnesium with the use of aluminum. There is a higher mechanical strength, for example, in comparing the modulus of elasticity between the metals. Aluminum has a ten million p.s.i., magnesium 6.5 million and zinc is indefinite due to creep characteristics. In addition, the natural film of aluminum oxide on aluminum is abrasion resistant which does not exist on the other metals. Through anodizing techniques an aluminum printing plate might well be anodized to obtain intrinsically hard coatings much harder than an electroplated coating which is now used on zinc and magnesium. Aluminum lends itself to the production of printing plates that are flat, curved, or cylindrical in shape.

In view of our invention and disclosure, variations and modifications to meet individual whim or particular need will doubtless become evident to others skilled in the art to obtain all or part of the benefits of our invention without copying the method shown, and we, therefore, claim all such insofar as they fall within the reasonable spirit and scope of our claims.

Having thus described our invention what we claim as new and desire to secure by Letters Patent is:

1. A method of etching the surface of aluminum and aluminum base alloy plates, which comprises masking portions of the plate with a resist, impinging an etching solution upon the surface of the plate to be etched, said solution comprising an aqueous solution of approximately 30° to 40° Bé. ferric chloride, from 0.08% to 1.6% by volume of a member of the group consisting of sulfated and sulfonated caster oil and from 0.8 to 3.2% by volume of a water-immiscible organic solvent substantially unreactive with the ferric chloride.

2. A method of etching according to claim 1, which comprises periodically adding hydrochloric acid to the etching solution.

3. A method of etching according to claim 2, in which the etching solution contains about 0.03% of hydrochloric acid and has a pH of about 1.

4. A method of etching according to claim 1, wherein the amount of castor oil plus organic solvent is within the range of from 1 to 5% of the total volume of the etching solution.

5. A method of etching according to claim 1, in which the ratio of organic solvent to castor oil is about 2.5 to 1.

6. A method of etching according to claim 1, in which the concentration of the ferric chloride is approximately 30° Bé.

7. A method of etching according to claim 1, in which the temperature of the etching solution is between 60 and 90° F.

8. A method of etching according to claim 1, in which the aluminum alloy is 61S.

References Cited

UNITED STATES PATENTS

| | | | |
|---|---|---|---|
| 2,886,420 | 5/1959 | Jones et al. | 156—19 |
| 3,340,195 | 9/1967 | Borth et al. | 156—14 |
| 2,640,765 | 6/1953 | Easley et al. | 156—14 |
| 3,296,142 | 1/1967 | Shever et al. | 252—79.4 |

JACOB H. STEINBERG, *Primary Examiner.*

U.S. DEPARTMENT OF COMMERCE

PATENT OFFICE

Washington, D.C. 20231

UNITED STATES PATENT OFFICE

CERTIFICATE OF CORRECTION

Patent No. 3,402,083 September 17, 1968

Robert J. Patsko et al.

It is certified that error appears in the above identified patent and that said Letters Patent are hereby corrected as shown below:

Column 2, line 50, "alumina" should read -- aluminum --.

Signed and sealed this 24th day of February 1970.

(SEAL)
Attest:

Edward M. Fletcher, Jr.
Attesting Officer

WILLIAM E. SCHUYLER, JR.
Commissioner of Patents

[redacted]